US00RE46671E

(19) United States
(12) Reissued Patent
Combi et al.

(10) Patent Number: US RE46,671 E
(45) Date of Reissued Patent: Jan. 16, 2018

(54) SUBSTRATE-LEVEL ASSEMBLY FOR AN INTEGRATED DEVICE, MANUFACTURING PROCESS THEREOF AND RELATED INTEGRATED DEVICE

(71) Applicant: STMicroelectronics S.r.l., Agrate Brianza (IT)

(72) Inventors: Chantal Combi, Oggiono Lecco (IT); Benedetto Vigna, Potenza (IT); Federico Giovanni Ziglioli, Pozzo d'adda (IT); Lorenzo Baldo, Bareggio (IT); Manuela Magugliani, Cornaredo (IT); Ernesto Lasalandra, San Donato Milanese (IT); Caterina Riva, Cusago (IT)

(73) Assignee: STMicroelectronics S.r.l., Agrate Brianza (IT)

(21) Appl. No.: 14/069,136

(22) Filed: Oct. 31, 2013

Related U.S. Patent Documents

Reissue of:
(64) Patent No.: 8,049,287
Issued: Nov. 1, 2011
Appl. No.: 12/102,709
Filed: Apr. 14, 2008

U.S. Applications:
(63) Continuation-in-part of application No. PCT/EP2006/064298, filed on Jul. 14, 2006.

(30) Foreign Application Priority Data

Oct. 14, 2005 (EP) ..... 0542719
Apr. 28, 2006 (WO) ..... PCT/EP2006/061940

(51) Int. Cl.
*H01L 29/84* (2006.01)
*B81C 1/00* (2006.01)

(52) U.S. Cl.
CPC .... *B81C 1/0023* (2013.01); *B81B 2201/0235* (2013.01); *H01L 2924/1461* (2013.01)

(58) Field of Classification Search
CPC ..... H01L 23/02; H01L 23/31; H01L 23/3114; H01L 23/00; H01L 24/12; H01L 21/44
(Continued)

(56) References Cited

U.S. PATENT DOCUMENTS 4,287,501 A 9/1981 Tominaga et al.
4,533,795 A * 8/1985 Baumhauer, Jr. ..... G01L 9/0073 29/25.35

(Continued)

FOREIGN PATENT DOCUMENTS

EP 1577656 A1 3/2004
EP 1 577 656 A1 9/2005

(Continued)

OTHER PUBLICATIONS

Sebastiano, Conti et al., "Assembly of a Capacitive Acoustic Transducer of the Microelectromechanical Type and Package Thereof," U.S. Appl. No. 12/777,058, filed May 10, 2010, 48 pages.

*Primary Examiner* — Leonardo Andujar
(74) *Attorney, Agent, or Firm* — Seed Intellectual Property Law Group LLP

(57) ABSTRACT

A substrate-level assembly having a device substrate of semiconductor material with a top face and housing a first integrated device, including a buried cavity formed within the device substrate, and with a membrane suspended over the buried cavity in the proximity of the top face. A capping substrate is coupled to the device substrate above the top face so as to cover the first integrated device in such a manner that a first empty space is provided above the membrane. Electrical-contact elements electrically connect the integrated device with the outside of the substrate-level assembly. In one embodiment, the device substrate integrates at least a further integrated device provided with a respective membrane, and a further empty space, fluidly (Continued)

isolated from the first empty space, is provided over the respective membrane of the further integrated device.

65 Claims, 6 Drawing Sheets

(58) Field of Classification Search
USPC ..... 257/416
See application file for complete search history.

(56) References Cited

U.S. PATENT DOCUMENTS 5,467,252 A * 11/1995 Nomi ..... H01L 23/3128 174/261
5,591,679 A 1/1997 Jakobsen et al.
5,869,749 A * 2/1999 Bonne ..... G01N 21/03 250/339.12
5,889,872 A 3/1999 Sooriakumar et al.
6,088,463 A 7/2000 Rombach et al.
6,437,412 B1 * 8/2002 Higuchi et al. ..... 257/416
6,522,762 B1 * 2/2003 Mullenborn ..... H04R 19/005 367/181
6,541,832 B2 * 4/2003 Coyle ..... 257/415
6,732,588 B1 5/2004 Mullenborn et al.
6,781,231 B2 8/2004 Minervini
7,436,054 B2 * 10/2008 Zhe ..... 257/686
7,763,488 B2 * 7/2010 Goodelle et al. ..... 438/51
8,049,287 B2 11/2011 Combi et al.
8,421,168 B2 4/2013 Allen et al.
8,433,084 B2 4/2013 Conti et al.
2002/0119807 A1 * 8/2002 Lee ..... H04M 1/72519 455/567
2004/0099918 A1 * 5/2004 Noguchi et al. ..... 257/416
2007/0040231 A1 * 2/2007 Harney et al. ..... 257/415
2009/0101998 A1 4/2009 Yen et al.
2010/0164083 A1 7/2010 Yim
2013/0221457 A1 8/2013 Conti et al.

FOREIGN PATENT DOCUMENTS

EP 1 684 079 A9 7/2006
JP 7-225240 A 8/1995
JP 9-304211 A 11/1997
JP 11111878 A 4/1999
JP 2003-163998 A 6/2003
JP 2005-180930 A 7/2005
JP 5043297 B2 10/2012
WO 2004/068094 A2 8/2004
WO 2007/112743 A 10/2007
WO 2007/112743 A1 10/2007

* cited by examiner

SUBSTRATE-LEVEL ASSEMBLY FOR AN INTEGRATED DEVICE, MANUFACTURING PROCESS THEREOF AND RELATED INTEGRATED DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

1. Technical Field

The present disclosure relates to a substrate-level assembly (usually known as "wafer-level package") for an integrated device and, in particular, a sensor device, as well as to a corresponding manufacturing process and the related integrated device.

2. Description of the Related Art

Semiconductor sensors are known (for example, pressure sensors, inertial sensors, microphones, or gas sensors) which are made with microfabrication techniques and whose operation is based upon the presence of a membrane that is suspended over a cavity.

For example, EP 1 577 656, filed in the name of the present applicant, describes a pressure sensor and a manufacturing process thereof. In detail (FIG. 1), the pressure sensor, designated by 1, is integrated in a substrate 2 made of semiconductor material, in particular monocrystalline silicon, having a top surface 2a. A buried cavity 3 is formed within the substrate 2, and is separated from the top surface 2a by a flexible and deformable membrane 4 suspended over the buried cavity 3 (in particular, the expression "buried cavity" denotes herein a cavity that is formed within a single body of semiconductor material at a distance from a top surface thereof). The buried cavity 3 is in this case also isolated and entirely contained within the substrate 2. Transducer elements 5, namely, piezoresistors formed by diffusion or implantation of dopant atoms, are arranged within the membrane 4, detect deformations of the membrane 4 (due to an applied pressure), and generate corresponding electrical signals as a function of the pressure to be detected. In brief, the manufacturing process of the pressure sensor 1 envisages: forming, within the substrate 2, a plurality of deep trenches, separated from one another by separation walls made of semiconductor material; then carrying out an epitaxial growth in a de-oxidizing environment so as to form an epitaxial layer, which closes the deep trenches at the top; and, finally, carrying out a thermal annealing step so as to form the buried cavity 3. A thin silicon layer remains above the buried cavity 3, and is constituted partly by epitaxially grown silicon atoms and partly by migrated silicon atoms; this silicon layer forms the membrane 4.

European patent application EP 05425028.7, filed in the name of the present applicant on Jan. 25, 2005, describes a piezoresistive accelerometer and a corresponding manufacturing process. In detail (FIG. 2), the piezoresistive accelerometer, designated by 10, has a structure substantially similar to that of the pressure sensor 1 described above, so that parts that are similar are designated by the same reference numbers, and moreover has an inertial mass 11, formed on the membrane 4, in particular approximately at the geometrical center of the membrane 4. The inertial mass 11 is constituted by welding paste, for example of silver, tin, copper, lead, gold, or other high-density metals, preferably having a density higher than 7000 kg/m$^3$. For example, the inertial mass 11 comprises a cylindrical base portion and a hemispherical top portion, and has a radius of between 100 μm and 200 μm and a thickness of between 50 μm and 350 μm (given a side of the membrane 4 of approximately 500 μm, the ratio between the radius of the inertial mass 11 and the side of the membrane 4 is between 20% and 40%).

The inertial mass 11 is deposited through a metal mesh, made, for example, of nickel or steel, having suitable openings in positions corresponding to the areas where the welding paste is to be deposited. Furthermore, the deposition is accompanied by a temperature increase step, during which the inertial mass 11 adheres to the top surface of the membrane 4, assuming, after cooling, the described shape.

The center of gravity of the inertial mass 11 is placed outside of the membrane 4, so that, in use, an acceleration acting on the accelerometer 10 determines a momentum on the inertial mass 11, which causes inclination thereof in a corresponding direction. The displacement of the inertial mass 11 causes a deformation of the membrane 4 and a variation in the resistivity of the piezoresistive elements 5, whence an appropriate detection circuit determines the amount of the acceleration acting on the accelerometer 10.

The aforesaid patent application No. EP 05425028.7 further discloses (FIG. 3) integration of the pressure sensor 1 and of the accelerometer 10 described above in separate and distinct surface portions of a same substrate 2 of semiconductor material, in particular to obtain a pressure monitoring system 15, for example, a so-called tire-pressure monitoring system (TPMS) for monitoring the inflating pressure of a tire for a vehicle. In use, the pressure monitoring system 15 is installed on the inside surface of a tire, and the pressure sensor 1 measures the state of inflation thereof, whilst the accelerometer 10 performs a wake-up function, by supplying a start-of-measurement signal to the pressure sensor 1 and a data-collection signal to an electronic circuit coupled thereto. In particular, the accelerometer 10 detects a centrifugal acceleration of the tire during rotation. An acceleration of intensity greater than a pre-set threshold is representative of a condition of movement of the vehicle, and consequently causes the start of pressure monitoring, so limiting monitoring to time intervals during which the vehicle is moving.

Moreover, MEMS microphone sensors are known, an example of which is shown in FIG. 4. The microphone sensor, designated by 16, is again integrated in a substrate 2 made of semiconductor material, having a top surface 2a, and comprises a buried cavity 3 formed within the substrate 2 and separated from the top surface 2a by a membrane 4 suspended over the buried cavity 3. The membrane 4 is fixed and has a plurality of holes (not shown) allowing the passage of air from the external environment to the buried cavity 3. A sensor diaphragm 17, which is flexible and free to move as a result of the air pressure, separates the buried cavity 3 from a back-chamber 18 formed at the back of the substrate 2. The membrane 4 and the sensor diaphragm 17 form two facing plates of a sensing capacitor, whose capacitance varies as a function of their relative distance. In use, the sensor membrane 17 undergoes deformation as a result of sound waves reaching the buried cavity 3, thus causing a corresponding variation of the capacitance value of the sensing capacitor.

The dimensions of the sensors described are particularly small, namely, in the region of 0.8 mm×0.8 mm×0.3 mm (length×width×thickness), or in the region of 2 mm×2 mm×0.3 mm, so that traditional packaging techniques do not prove advantageous, and in particular packages of a traditional type, of a molded or pre-molded type, prove to be of excessive encumbrance and in any case not optimized for applications, such as automotive or consumer applications, which require size minimization. For example, existing packages for MEMS microphones envisage the use of a rather bulky metallic casing (or made by a combination of FR4 and a metallic material) which protects and electrostatically shields the sensor die. Moreover, packages of the traditional type are not optimized in terms of manufacturing costs.

On the other hand, the tendency to use alternative packaging techniques for integrated devices is known, said techniques enabling a reduction in the overall dimensions of the resulting electronic devices, and a simultaneous reduction in the manufacturing costs. In particular, the so-called "wafer-level packaging" technique is known, which envisages formation of a protection layer directly on top of a layer of semiconductor material housing integrated devices, to mechanically protect the integrated devices.

BRIEF SUMMARY

The present disclosure provides a substrate-level assembly for integrated devices that will enable minimization of the costs of the manufacturing process and of the final dimensions of the corresponding electronic devices.

According to the present disclosure, a substrate-level assembly and a manufacturing process are consequently provided.

In accordance with one embodiment of the present disclosure, a substrate-level assembly is provided that includes a device substrate of semiconductor material having a top face and housing a first integrated device provided with an active area in the proximity of said top face; a capping substrate coupled to the device substrate above said top face so as to cover the first integrated device in such a manner that a first empty space is provided in a position corresponding to the active area; and electrical-contact elements for electrical connection of the first integrated device outside of the substrate-level assembly.

In accordance with another embodiment of the present disclosure, an electronic device is provided that includes the substrate-level assembly described above, and a package encasing and mechanically protecting the substrate-level assembly, the package having a base body mechanically supporting the substrate-level assembly and a coating region configured to coat laterally the substrate-level assembly.

In accordance with another embodiment of the present disclosure, a process for manufacturing a substrate-level assembly is provided, the processing including providing a device substrate of semiconductor material, having a top face; forming a first integrated device within the device substrate and with an active area in the proximity of the top face; coupling a capping substrate to the device substrate above the top face so as to cover the first integrated device, the coupling comprising forming a first empty space in a position corresponding to the active area; and forming electrical-contact elements for electrical connection of the first integrated device with the outside of the substrate-level assembly.

In accordance with another embodiment of the present disclosure, an assembly is provided, the assembly including an article, and a sensor assembly adapted to monitor at least one condition of the article, the sensor assembly including a device substrate of semiconductor material, having a top face and housing a first integrated device provided with an active area in the proximity of the top face; a capping substrate coupled to the device substrate above the top face so as to cover the first integrated device in such a manner that a first empty space is provided in a position corresponding to the active area; and electrical-contact elements for electrical connection of the first integrated device outside of the substrate-level assembly.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 5:
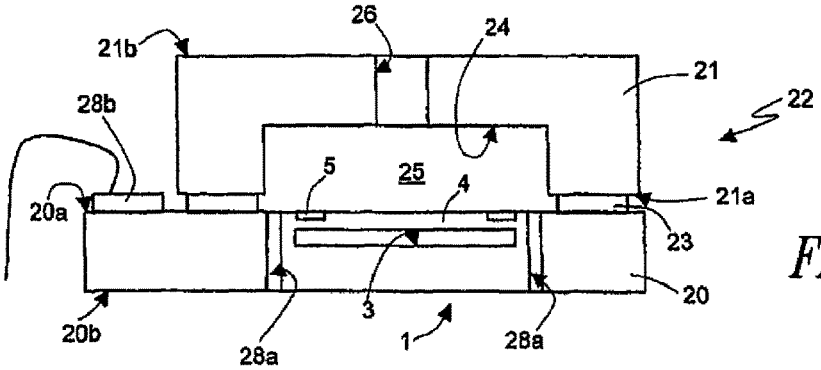
FIG. 5 is a cross-sectional view of a substrate-level assembly for a pressure sensor, according to an aspect of the present disclosure.

FIG. 5 shows a substrate 20 of semiconductor material, for example, monocrystalline silicon, having a top surface 20a and a bottom surface 20b, opposite to the top surface 20a (in what follows, the substrate 20 will be referred to as "device substrate," in so far as it is designed to integrate one or more integrated devices, in particular, sensor devices).

Figure 1:
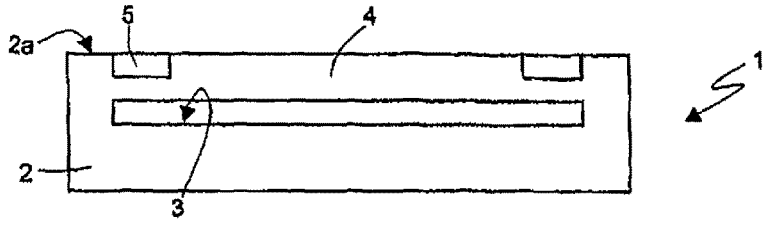
FIG. 1 (Prior Art)
FIG. 1 is a cross-sectional view of a pressure sensor of a known type.
Figure 2:
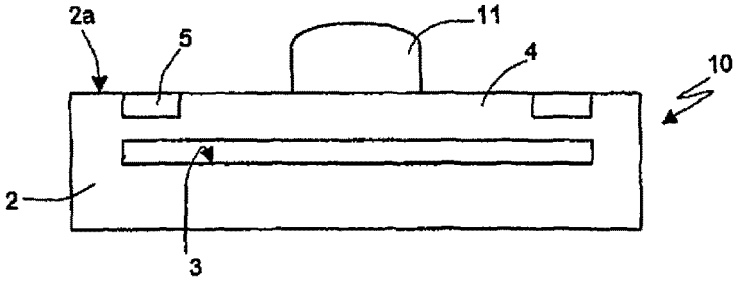
FIG. 2 (Prior Art)
FIG. 2 is a cross-sectional view of an inertial sensor of a known type.

An integrated device, namely a pressure sensor 1, is formed inside the device substrate 20, as described with reference to FIG. 1 (so that parts that are similar are designated by the same reference numbers). In particular, the membrane 4, suspended over the buried cavity 3, is formed at the top surface 20a of the device substrate 20.

According to an aspect of the present disclosure, a capping substrate 21, made of semiconductor material (for example, silicon), glass, or other ceramic or polymeric material, is (mechanically or electrically or a combination of mechanically and electrically) coupled to the device substrate 20, on top of the top surface 20a, so as to coat and protect the pressure sensor 1 and so as to provide a substrate-level assembly 22 for the pressure sensor 1. In particular, by the expression "substrate-level assembly" is meant herein the composite structure comprising the device substrate 20, the capping substrate 21, and the corresponding electrical input/output connections (made as described hereinafter).

According to an aspect of the present disclosure, the capping substrate 21 is joined to the device substrate 20 via a bonding process, which exploits a bonding region 23 (advantageously a sealing region), set in contact with, and on top of, the top surface 20a, to ensure joining. For example, the bonding region 23 is made of glass frit or a metal or polymeric material. The bonding region 23 has a ring conformation, and surrounds, without being superimposed thereon, the membrane 4 of the pressure sensor 1. Furthermore, the bonding region 23 has a main dimension of extension of between 100 μm and 300 μm, in the case of glass-frit bonding, and smaller than 100 μm, in the case of metal bonding, with a maximum thickness of approximately 10 μm in both cases.

According to an aspect of the present disclosure, a sensor cavity 24 is formed within the capping substrate 21, in a position corresponding to, and in communication with, the membrane 4. The sensor cavity 24 is made, for example, via an anisotropic (or isotropic) chemical etch, starting from a first surface 21a of the capping substrate 21 in contact with the device substrate 20, and has a depth of between 10 μm and 400 μm. Consequently, after joining between the device substrate 20 and the capping substrate 21, an empty space 25 remains over the membrane 4 so as to ensure freedom of movement thereof and so as not to alter deformation thereof as a function of a pressure applied. In particular, the empty space 25 is defined partly by the thickness of the bonding region 23 and partly by the sensor cavity 24 dug in the capping substrate 21, and is delimited partly by the bonding region 23 and partly by the walls of the sensor cavity 24.

Furthermore, a first access duct 26 is formed within the capping substrate 21, starting from a second surface 21b of the capping substrate 21, not in contact with the device substrate 20, and reaching the sensor cavity 24, in such a manner as to be fluidically connected to the empty space 25 and to the outside of the capping substrate 21. For example, the first access duct 26 can be formed via an anisotropic chemical etch or a deep silicon etch or a combination thereof.

Electrical input/output connections are finally provided for electrical connection of the pressure sensor 1 with the outside of the substrate-level assembly 22, in the form of through vias 28a, which traverse the device substrate 20 until the bottom surface 20b is reached, or else in the form of connection pads 28b carried by a portion of the top surface 20a placed externally of the bonding region 23 and the capping substrate 21 so as to be accessible from the outside and enable contact using the "wire-bonding" technique (as illustrated schematically in FIG. 5 and in the subsequent figures). In particular, the input/output electrical connections 28a, 28b are connected, for example, via metallizations (not shown), to transduction elements 5 of the membrane 4. The through vias 28a can be formed with any known technique, for example, by means of conductive through holes, obtained by etching of the device substrate 20, so as to form through trenches extending throughout the thickness of the substrate, and by subsequent filling of said through trenches with a conductive material, for example, with a metal material. The use of the through vias 28a is advantageous for reducing the dimensions of the resulting assembly.

In use, a fluid at a given pressure, the value of which must be determined, penetrates within the capping substrate 21 through the first access duct 26, reaches the empty space 25, and acts on the membrane 4, e.g., causing its deformation, which is detected by the transduction elements 5.

Figure 6:
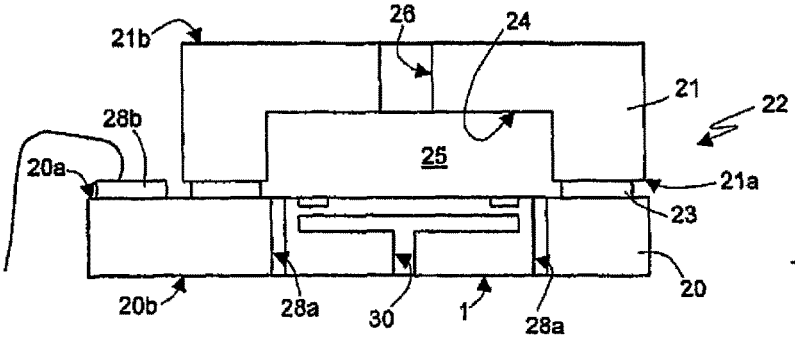
FIG. 6 is a cross-sectional view of a substrate-level assembly for a differential pressure sensor.

FIG. 6 shows a substrate-level assembly 22 for a differential pressure sensor. In this case, a second access duct 30 is formed through the device substrate 20, starting from the bottom surface 20b as far as the buried cavity 3 and so as to be in fluid connection with the buried cavity 3. For example, the second access duct 30 is made via a digging from the back or bottom of the device substrate 20 by means of an anisotropic chemical etch.

In use, the outer surface of the membrane 4 (opposite, i.e., to the buried cavity 3) is set in communication with a fluid at a first pressure through the first access duct 26 made through the capping substrate 21. The internal surface of the membrane 3, instead, is set in communication with a fluid at a second pressure through the second access duct 30. In this way, the membrane 3 deforms as a function of the difference between the first and second pressures so as to enable a differential measurement of pressure.

Figure 7:
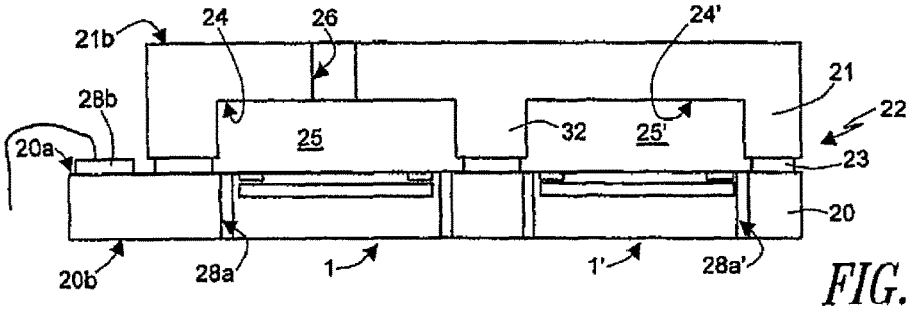
FIG. 7 is a cross-sectional view of a substrate-level assembly for a relative pressure sensor.

FIG. 7 shows a substrate-level assembly 22 for a relative pressure sensor. In detail, within the device substrate 20, in addition to the pressure sensor 1, a reference pressure sensor 1' is formed, in a surface portion of the device substrate 20, separate and distinct from the one dedicated to integration of the pressure sensor 1. A further sensor cavity 24' is formed in the capping substrate 21, in a position corresponding to the reference pressure sensor 1', so as to ensure the presence of a further empty space 25' above the respective membrane 4' of the reference pressure sensor 1'. The further empty space is closed and not accessible from the outside, since no access duct is provided in fluidic communication therewith. The bonding region 23 surrounds in this case the membrane of both of the pressure sensors, without being superimposed thereon, and is, for example, shaped like the figure eight. A separation portion 32 of the capping substrate 21 is placed between the sensor cavity 24, 24', and between the respective empty spaces 25, 25'. In particular, the separation portion 32, together with the underlying bonding region 23, separates in a fluid-tight manner the two empty spaces 25, 25', which are thus fluidically isolated.

In use, within the further sensor cavity 24' a fluid having a given reference pressure is entrapped, whilst the sensor cavity 24 is set in fluid communication with a fluid at a given pressure through the first access duct 26 so as to implement a relative pressure measurement.

Figure 3:
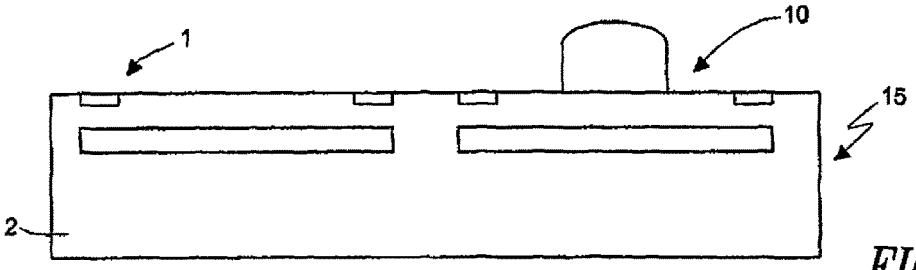
FIG. 3 (Prior Art)
FIG. 3 is a cross-sectional view of a pressure monitoring system of a known type.
Figure 8:
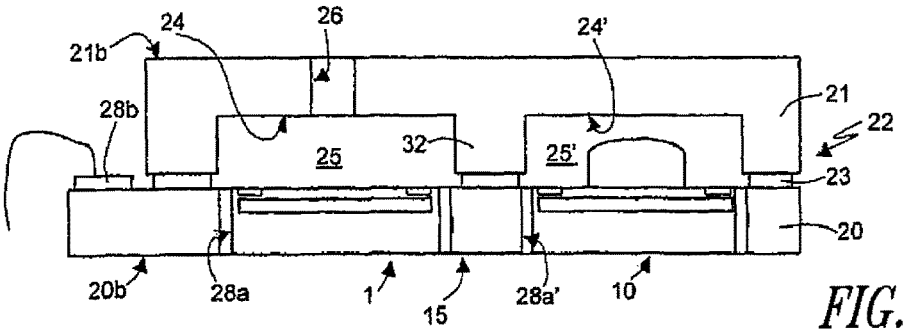
FIG. 8 is a cross-sectional view of a substrate-level assembly for a pressure monitoring device.

FIG. 8 shows a currently preferred embodiment of the present disclosure and, in particular, a substrate-level assembly 22 for a pressure monitoring device 15 of the type described with reference to FIG. 3, in particular configured to monitor the inflating pressure of a tire of a vehicle. In detail, in distinct surface portions of the device substrate 20, a pressure sensor 1 and an accelerometer 10 are integrated. Also in this case, in a way similar to what has been described above, the further sensor cavity 24' corresponding to the accelerometer 10 is provided, so as to ensure the further empty space 25' within which the inertial mass 11 is free to move to cause a corresponding deformation of the respective membrane 4'. In addition, further input/output electrical connections 28a' are provided for ensuring electrical connection of the accelerometer 10 with the outside of the substrate-level assembly 22, also in this case in the form, for example, of through vias. Advantageously, in a way not illustrated, an appropriate electronic circuit (or ASIC—Application Specific Integrated Circuit) connected to the accelerometer 10 and to the pressure sensor 1 can also be integrated within the device substrate 20.

In use, the accelerometer 10 detects an acceleration imparted on the monitoring device as a function of the deformation of the respective membrane 4', due to the displacement of the inertial mass 11. As described above, the separation portion 32 of the capping substrate 21, and the bonding region 23, set between the free spaces 25, 25' do not enable the fluid under pressure to reach the further sensor cavity 24'.

Figure 9:
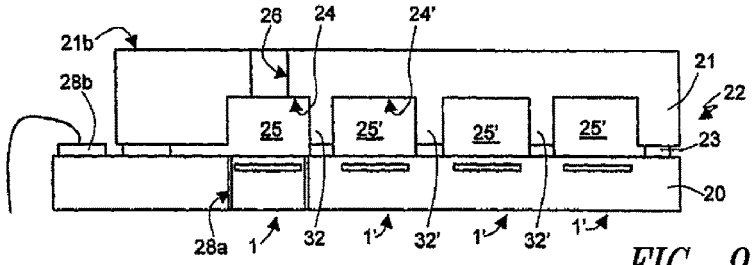
FIG. 9 is a cross-sectional view of a substrate-level assembly for an integrated device comprising a plurality of semiconductor sensors.

In general, the device substrate 20 can integrate an arbitrary number of sensor devices, and in this case there is provided a corresponding number of additional free spaces 25', fluidically isolated from one another, and possibly of additional sensor cavities 24', separated by additional separation portions 32' of the capping substrate 21, and of additional access ducts communicating with respective sensor cavities. By way of example, in FIG. 9 four sensors 1, 1' integrated in a same device substrate 20 are shown. It is clear that each one of the sensors shown can be a pressure sensor, possibly a differential pressure sensor or a relative pressure sensor, or an accelerometer (or another type of sensor device) and a corresponding number of first and second access ducts can be provided.

Figure 10:
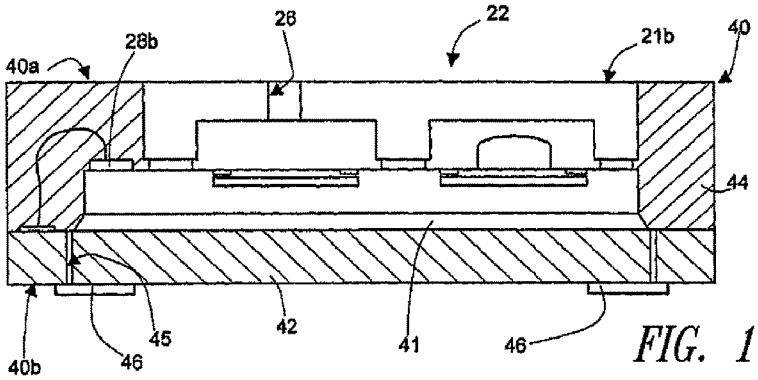
FIG. 10 is a cross-sectional view of an electronic device comprising a package and a substrate-level assembly, according to an aspect of the present disclosure.
Figure 11:
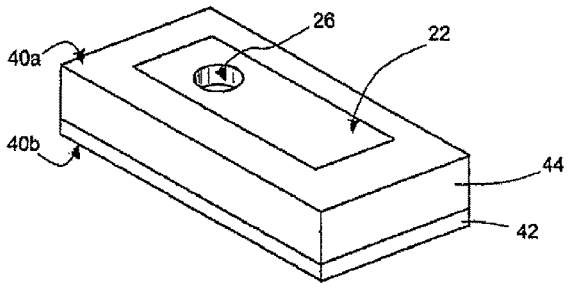
FIG. 11 is a perspective view of the electronic device of FIG. 10.

According to a further aspect of the present disclosure (FIGS. 10 and 11), the substrate-level assembly 22 can further be encased in a package 40, of a land-grid-array (LGA) type, SO, QFN or ball-grid-array (BGA) type. In detail (FIG. 10), the substrate-level assembly 22 (in particular, FIG. 10 shows the case where the device substrate 20 integrates a pressure sensor 1 and an accelerometer 10) is joined, via an adhesion layer 41, to a base body 42, in particular, a multilayer organic substrate (for example a BT—Bismaleimide Triazine—layer), defining the base of the package 40. The adhesion layer 41 includes an epoxy or acrylic glue, or bismaleimide (BMI), or else an epoxy, or acrylic, or bismaleimide laminated layer. The base body 42 has a size greater than that of the substrate-level assembly 22, and hence has outer portions not covered by the assembly. Then, via a mould of appropriate shape and size, the substrate-level assembly 22 is covered at the sides by a coating 44, made of plastic material, for example including resin. In particular, the coating 44 covers at the top the outer portions of the base body 42, but does not cover the second surface 21b of the capping substrate 21 (i.e., the surface not in contact with the device substrate 20), which hence constitutes part of a first outer face 40a of the package 40. In this way, the first access duct 26 remains free and exposed on the outside of the package 40 (as is evident from FIG. 11). In addition, further through vias 45, formed through the base body 42, are connected to the connection pads 28b of the substrate-level assembly 22 (for example, via conductive paths, not shown, arranged at the outer portions of the base body 42), and to outer contact pads 46, made of metal material, carried by an outer surface of the base body 42, defining a second outer face 40b of the package 40. In the case of an LGA package, the contact pads 46 constitute the input/output interface towards the outside of the package 40. In the case of a BGA package, conductive bumps, for example metal balls (not shown), are instead provided for said purpose and are in direct contact with the outer contact pads 46. Advantageously, the outer face 40a of the package 40 may be covered with a temporary protection layer, in order to protect the integrated devices during storage or assembling procedures. Also, it is clear that the second access duct 30, if present (e.g., in the case of a differential pressure sensor), extends also through the adhesion layer 41 and the base body 42, in order to reach the second outer face 40b of the package 40.

Figure 4:
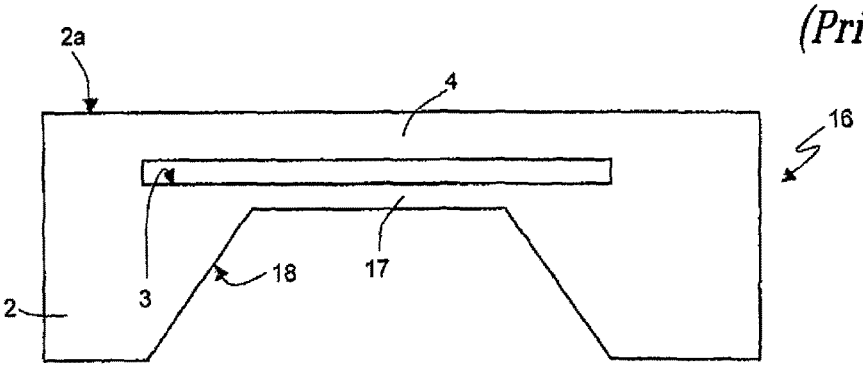
FIG. 4 (Prior Art)
FIG. 4 is a cross-sectional view of a microphone sensor of a known type.
Figure 12:
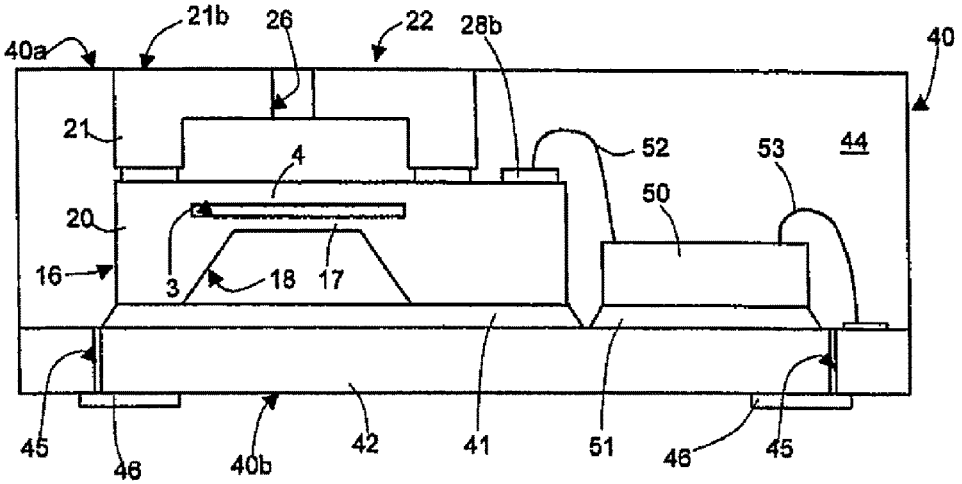
FIG. 12 is a cross-sectional view of a further electronic device comprising a package and a substrate-level assembly.

FIG. 12 shows another example of the package 40, encasing a substrate-level assembly 22 including a device substrate 20, integrating in this case a microphone sensor 16 (see FIG. 4, but it is clear that the same teachings applies mutatis mutandis to all sensor devices described therein, e.g., to a pressure sensor), and the capping substrate 21, having the first access duct 26 allowing passage of sound waves towards the sensor diaphragm 17 of the microphone sensor 16. The package 40 further encases an ASIC die 50 integrating a processing circuit electrically coupled to the microphone sensor 16. The ASIC die 50 is joined to the base body 42 via a respective adhesion layer 51, laterally with respect to the substrate-level assembly 22, and is surrounded and completely covered by the coating 44. First electrical connections 52 (e.g., electrical wires) connect (e.g., via the wire-bonding technique) the ASIC die 50 to the connection pads 28b of the device substrate 20, while second connections 53 connect the ASIC die 50 to the further through vias 45 made through the base body 42, and to the outer contact pads 46.

Figure 13:
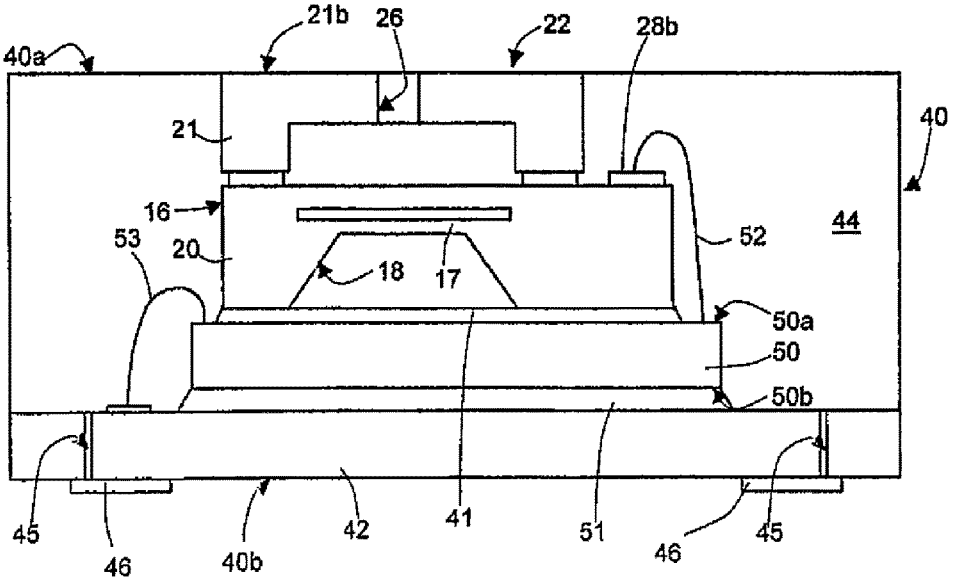
FIG. 13 shows a variant of the electronic device of FIG. 12.

A possible variant of the package 40 envisages, FIG. 13 (which again refers to the microphone sensor without this however implying any loss of generality), stacking of the substrate-level assembly 22 and the ASIC die 50 within the coating 44. In detail, the ASIC die 50 is joined to the base body 42 with a first surface 50a thereof, and the device substrate 20 is joined to a second surface 50b (opposite to the first surface 50a) of the ASIC die 50 via the adhesion layer 41, thus being stacked to the ASIC die within the package 40. Also in this case, the first access duct 26 remains free and exposed on the outside of the package 40, and the second surface 21b of the capping substrate 21 constitutes part of a first outer face 40a of the package 40. Again, the first and second connections 52, 53 are provided, for example originating from respective connection pads on a portion of the second surface 50b of the ASIC die 50 not covered by the adhesion layer 41.

Figure 14:
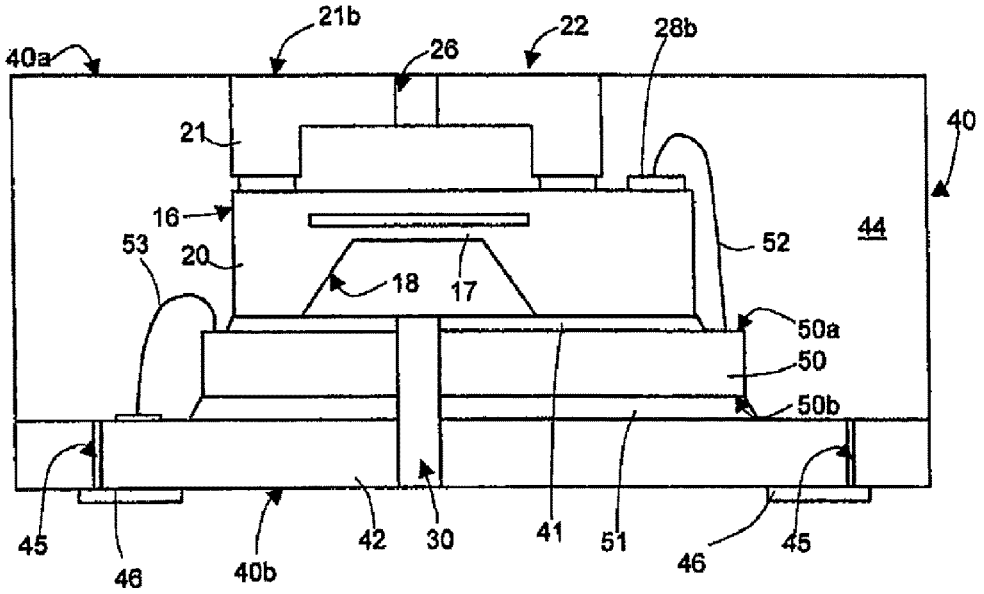
FIGS. 14-16 show further variants of the electronic device of FIG. 13.

As shown in FIG. 14, in case of the above described stacked arrangement, the second access duct 30, if present, can extend through the base body 42, the adhesion layers 41 and 51, and the ASIC die 50 for an entire thickness thereof. In the case of the microphone sensor 16, the second access duct 30 reaches the back-chamber 18, thus increasing its size, and the diaphragm 17 from the back.

The described substrate-level assembly has the following advantages.

In particular, the manufacturing process of the assembly is optimized in terms of costs and duration, in so far as it is performed directly starting from the device substrate, with process steps that are a continuation of those used for the formation of the integrated sensors. The resulting assemblies have extremely contained dimensions, which are generally in the region of 1.7 mm×1.7 mm×0.8 mm but can reach 1.3 mm×1.3 mm×0.8 mm in the case of just one pressure sensor, and which are generally in the region of 1.7 mm×2.5 mm×0.8 mm, but can reach 1.3 mm×2.5 mm×0.8 mm in the case of the pressure monitoring device (which integrates both the pressure sensor and the accelerometer). In particular, in the latter case, a single substrate-level assembly is advantageously provided for the pressure sensor and for the accelerometer, and said assembly enables an effective fluid isolation between the empty spaces provided above the membrane of the two sensors.

The substrate-level assembly can constitute a complete device made of semiconductor material, in so far as the integrated sensors housed within the device substrate are automatically protected from the back by the device substrate 20 and on the top by the capping substrate 21. However, the use of the package 40 can be advantageous in all the cases where it is not convenient to have a complete integrated device made of semiconductor material (for example, in the case where particular environmental conditions require a further protection from the outside environment). In any case, also the package 40 has small dimensions, in the region of 3 mm×3 mm×1 mm.

Furthermore, the package 40, as well as the substrate-level assembly 22, can be handled and positioned easily, and in particular can be advantageously used as surface-mount devices (SMDs).

The described manufacturing process does not envisage the use of protection gels, as is, instead, required in the case where molded packages of a traditional type are used.

Finally, it is clear that modifications and variations can be made to what is described and illustrated herein, without thereby departing from the scope of the present disclosure, as defined in the attached claims.

In particular, the capping substrate 21 can advantageously be doped in order to increase its conductivity and provide an electrostatic shielding for the sensor(s) integrated within the device substrate 20. To improve this shielding effect (which is important, for example, in the case where the electronic device integrating the substrate-level assembly is a mobile phone), also the bonding region 23 could be made conductive so as to shield the electromagnetic radiations.

The capping substrate 21 can also be realized by means of an epitaxial or galvanic (electroplating) growth on the device substrate 20 instead of being bonded thereto, in order to be integral with the device substrate 20. In this case, the empty space 25 can be provided with standard techniques, e.g., by etching of a sacrificial layer interposed between the device substrate and the grown layer.

Figure 15:
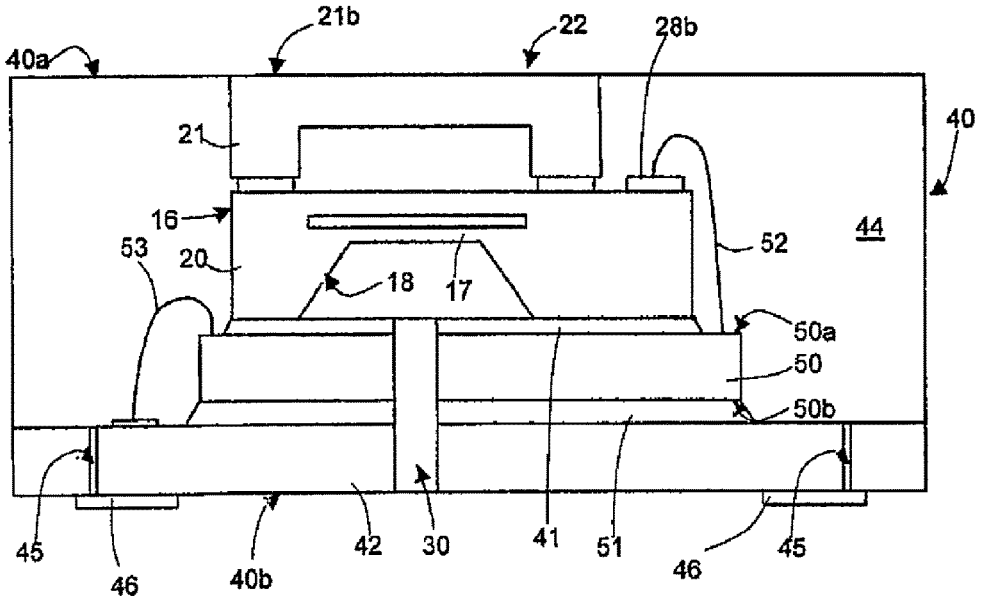

Alternatively, as shown in FIG. 15, in the case of the microphone sensor 16 (or any other type of sensor envisaging the presence of a back chamber), the back-chamber could be made by the empty space 25, with no access duct being provided in the capping substrate 21; in this case, the second access duct 30, extending through the base body 42, the adhesion layer 41 and the ASIC die 50 and in communication with the back-chamber 18 (now having the function of the empty space 25, due to the reversal arrangement), allows the communication with the outside of the package. Also (in a way not shown), since no access duct is provided in the capping layer 21, the same capping layer could even be coated on its second surface 21b by the coating 44; in this case, the same ASIC die could have a capping function for the integrated sensors. An analogous structure could be used for a relative pressure sensor, the first empty space 25 containing a first fluid at a reference pressure, and the second access duct 30 allowing a second fluid to enter the buried cavity 3.

Figure 16:
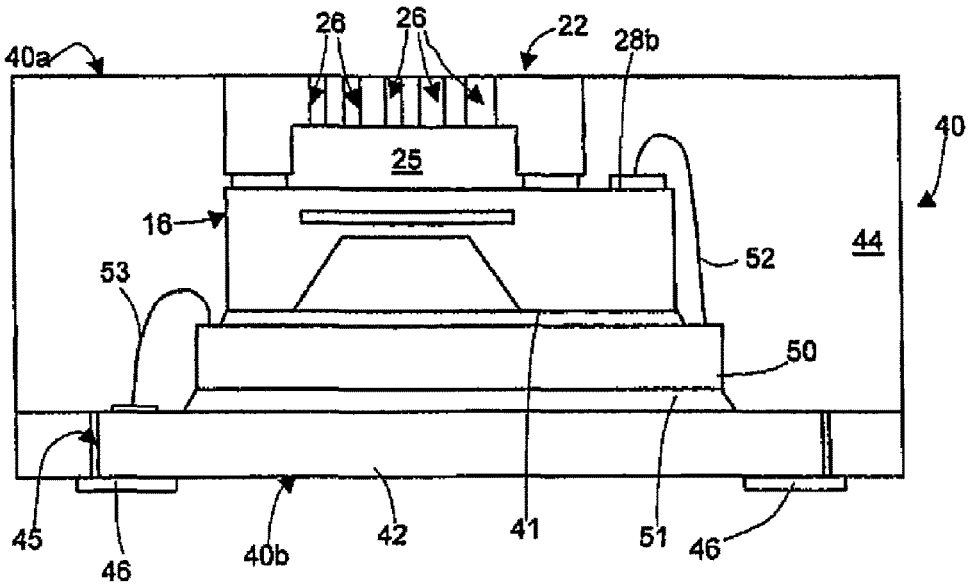

Furthermore, as shown in FIG. 16 that depicts, as an example, a variant of the package of FIG. 13, a plurality of openings can be provided in the capping substrate 21 to provide a plurality of access ducts 26 to the underlying empty space 25; in particular, different size, inter-spacing and position can be envisaged for the various access ducts 26. For example, the presence of a plurality of access ducts can reduce the risk of damages to the sensor membranes due to the external environment. It is clear that such a variant also applies to the other embodiments previously described, e.g., to the pressure or accelerometer sensor, or to the combination thereof; also, it is clear that in the case where the substrate-level assembly comprises a plurality of semiconductor sensors (as shown e.g., in FIG. 9), the capping substrate 21 can be provided with one or more access duct 26 (even of different size, inter-spacing and position) communicating with one or more of the empty spaces 25, 25' associated with the various sensors.

It should be clear that the substrate-level assembly 22 could be encased in the package 40 even with more than one die, integrating other circuits or passive components, in a stacked or side-by-side arrangement, as described previously.

Also, in the substrate-level assembly the device substrate could house other types of micromechanical devices, e.g., not provided with a membrane, having an active area at a top surface thereof that must remain free and/or accessible from the outside of the assembly (or package). In the sensors described, the active area comprises the membrane suspended over the buried cavity.

Joining between the device substrate 20 and the capping substrate 21 can be made via direct or anodic bonding, so without the need to envisage the bonding region 23 on the top surface 20a of the device substrate 20. In this case, the empty space 25 above the membrane 4 is determined just by the sensor cavity 24, which accordingly must be appropriately sized.

Figure 17:
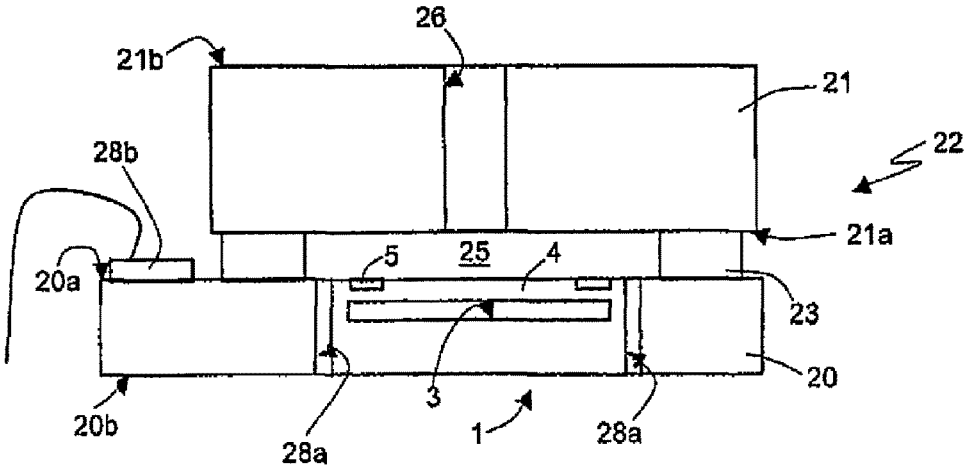
FIG. 17 shows a possible variant of the substrate-level assembly of FIG. 5.

Instead, as shown in FIG. 17, in the case where the bonding region has a sufficient thickness, the sensor cavity 24 could not be provided within the capping substrate 21 (which remains flat and not patterned). In this case, the empty space 25 is defined and surrounded just by the bonding region 23. The cavity is thus realized using the bonding material, such as glass-frit, polymer and so on, as spacer between the device substrate 20 and (in this case) a flat, not patterned capping substrate 21; the thickness of this spacer can be in the range of 6-80 (or even 100) μm.

Furthermore, above the membrane of the integrated sensors, a single through cavity could be provided (not illustrated), which traverses the entire thickness of the capping substrate 21 and is consequently accessible from outside the substrate-level assembly 22.

The capping substrate 21 could be patterned also on the outer and exposed side (second surface 21b), e.g., for realizing a first access duct with a different shape (having a larger section towards the outside).

Even though FIG. 10 illustrates the case where the substrate-level assembly 22 is connected to the outside via wire bonding and the connection pads 28b, it is evident that a similar structure can be provided using the through vias 28a. In particular, in this case, the through vias 28a traverse the adhesion layer 41 and are connected, for example via conductive paths, to the additional through vias 45.

In addition, further types of sensors can be integrated within the device substrate 20. For example, a gas sensor can be integrated therein, which also bases its operation upon the presence of a membrane suspended over a cavity. Also for said sensor a respective first access duct 26 must be provided to enable entry of a fluid within the substrate-level assembly 22. In detail, the suspended membrane 4 is covered by a layer of sensing material, depending on the chemical(s) it is desired to detect. The membrane is important to guarantee a thermal decoupling with the substrate device 20 during the assembling steps. The silicon cap acts as a protection for the gas sensor, and can be covered with a sticky foil or any other laminated film during a storage period, in order to prevent dust and moisture from damaging the sensor. It is advantageous that the electrical input/output connections (e.g., the connection pads 28b) are arranged outside the capping substrate 21 and covered by the coating 44, so that any kind of damages is avoided due to the presence of the fluid to be detected within the first empty space 25 (especially in case of a humidity sensor).

The deformation of the membrane 4 of the integrated sensors could be detected with capacitive, instead of piezoresistive, techniques in a known way which is not described in detail.

The inertial mass 11 could have a shape different from the one described and illustrated; in any case, it is configured so as to be affected by the accelerations imparted on the integrated device, and to undergo a consequent displacement.

Finally, it is clear that the pressure monitoring device described can be used for other applications. For example, in the automotive field, it can be used for monitoring the pressure of the air-bag, for checking the pressure of failure of an ABS system, or for monitoring the pressure of the oil or the pressure of injection of the fuel.

Other possible applications are in the medical field, where the pressure sensor can be used for monitoring blood pressure, or in ink-jet applications. In the latter case, an ink chamber can be provided within the capping substrate 21; the first access duct 26 acts as a nozzle, offering a way out for the ink contained within the empty space 25 when heated by an appositely provided circuitry, which can be implemented in the suspended membrane. In particular, in this application, the presence of a flared access duct to the empty space 25 could be advantageous to facilitate ink expulsion. Accordingly, the manufacturing process of the capping substrate 21 could envisage a first etching, of a wet type, to provide the sensor cavity 24 having sloping lateral walls and a tapered section towards the outside, and a second etching, of a dry type, to provide the first access duct 26, having rectilinear walls and a smaller section.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. [A substrate-level] *An* assembly, comprising:

a device substrate of semiconductor material[,] having a top face [and housing a first integrated device provided with an active area adjacent to the top face] *that includes a first buried cavity in the device substrate and a first membrane suspended above the first buried cavity, the device substrate further including a second membrane*;

a [capping substrate] *cap* coupled to the device substrate above the top face [so as to cover the first integrated device in such a manner that] *and covering an upper portion of the device substrate and forming* a first empty space [is provided in a position corresponding to the active area] *between an inner surface of the cap and the first membrane of the device substrate and forming a second empty space between an inner surface of the cap and a surface of the second membrane, the first and second empty spaces being isolated from each other; and*

*an access duct in the cap that provides fluid connectivity between the first empty space and an environment outside of the assembly*; and electrical-contact elements for electrical connection of the [first integrated device] *device substrate to a location* outside of the [substrate-level] assembly.

2. The assembly of claim 1, wherein [the first integrated device is provided with a buried cavity formed within the device substrate and a membrane suspended over the buried cavity at the active area; the first empty space being provided in a position corresponding to the membrane] *electrical-contact elements include at least one of contact pads located on the top surface of the device substrate or on a bottom surface of the device substrate*.

3. The assembly of claim [1, wherein an access duct is provided within the capping substrate, the access duct being fluidly connected to the first empty space and to the outside of the substrate-level assembly] *2 wherein the electrical-contact elements include through vias that are coupled to a respective contact pad on the bottom surface of the device substrate*.

4. The assembly of claim 1, wherein [the capping substrate has a first sensor cavity above the active area of the first integrated device, the first sensor cavity forming at least in part the first empty space; in particular,] the first [sensor cavity having] *empty space has* a depth in the range of 10 μm and 400 μm.

5. The assembly of claim 1, further comprising *a surface of the cap bonded to a surface of the device substrate at* a bonding region [arranged between the device substrate and the capping substrate to ensure joining thereof, and placed in contact with the top face in such a manner as to surround, without being superimposed thereon, the active area of the first integrated device; the first empty space being delimited, at least in part, by the bonding region].

6. The assembly of claim 5, wherein [the capping substrate is flat and not patterned and] the bonding region has a thickness between 6 μm and 100 μm [to entirely define a thickness of the first empty space].

7. The assembly of claim 5, wherein the [capping substrate includes one between] *cap is formed from at least one of the following materials*: semiconductor material, glass, ceramic, and polymeric material[; and wherein the bonding region includes glass frit or a metal or polymeric material].

8. The assembly of claim 5, wherein [at least one of] the [capping substrate] *cap* and bonding region is made of a conductive material configured to provide an electrostatic shield for the first integrated device[; the first integrated device comprising], *and wherein the first membrane is part of* a microphone.

9. The assembly of claim [2, wherein the electrical-contact elements comprise at least one of through vias made through the device substrate and electrical-connection pads formed on a portion of the top face of the device substrate not covered by the capping substrate; and] *1* wherein the [first integrated device further comprises a buried cavity formed within the device substrate, a membrane suspended over the buried cavity, and] *device substrate includes* transduction elements configured to transform a deformation of the *first* membrane into electrical signals, the electrical-contact elements being [connected] *coupled* to the transduction elements.

10. The assembly of claim 1, [wherein the first integrated device further comprises a buried cavity formed within the device substrate and a membrane suspended over the buried cavity; and a first access duct is provided within the capping substrate and fluidly connected to the first empty space and to the outside of the substrate-level assembly; and] *further comprising* a second access duct is provided within the device substrate in fluid communication with the *first* buried cavity [of the integrated device] and with the *environment* outside of the [substrate-level] assembly.

11. The assembly of claim 1, wherein [a first access duct and a plurality of further access ducts are provided within the capping substrate, and fluidly connected to] *the cap includes a plurality of access ducts that provide fluid connectivity between* the first empty space and to the *environment* outside of the [substrate-level] assembly[; the first and further access ducts being at least one of: different size and separated by a different inter-spacing].

[12. The assembly of claim 1, wherein the device substrate houses at least a further integrated device provided with a respective active area; and wherein a further empty space is provided in a position corresponding to the respective active area of the further integrated device; the further empty space being fluidly isolated with respect to the first empty space.]

13. The assembly of claim [12] *1*, wherein [the capping substrate has at least one further sensor cavity set above the respective active area of the further integrated device, and forming, at least in part, the further empty space; the first empty space and further empty space separated in a fluid-tight manner, at least in part, by a separation portion of the capping substrate placed between the first empty space and the further empty space] *the second empty space is not in fluid communication with the environment outside the assembly*.

14. The assembly of claim [12] *1*, [further comprising a bonding region placed between the device substrate and the capping substrate, and in contact with the top face of the device substrate in such a manner as to surround, without being superimposed thereon, the active area of the first integrated device and the respective active area of the further integrated device; the first empty space and the further empty space being delimited, at least in part, by the bonding region] *wherein the device substrate includes a second buried cavity and the second membrane is suspended above the second buried cavity*.

15. The assembly of claim [12] *1*, wherein [the first integrated device further comprises a buried cavity formed within the device substrate and a membrane suspended over the buried cavity, and the further integrated device comprising a respective buried cavity formed within the device substrate and a respective membrane suspended over the respective buried cavity; and wherein the first integrated device is a pressure sensor, and the further integrated device is an inertial sensor, the inertial sensor comprising an inertial mass arranged on the respective membrane within the further empty space] *the second membrane is an inertial sensor*.

16. The assembly of claim 15, wherein the inertial *sensor includes an inertial* mass *arranged on the second membrane and the inertial mass* includes metal material[,] deposited directly on top of the [respective] membrane[; the metal material chosen from the group comprising silver, tin, copper, lead, and gold, and having a density greater than 7000 $kg/m^3$].

17. The assembly of claim [12] *1*, wherein the first [integrated device comprises] *membrane, the first empty space, and the first buried cavity are part of* a pressure sensor, and the [further integrated device comprises] *second membrane, second empty space, and a second buried cavity are part of* a reference pressure sensor for the pressure sensor.

18. The assembly of claim 1, wherein the first [integrated device further comprises a buried cavity formed within the device substrate and a membrane suspended over the buried cavity; the first integrated device comprising] *membrane, the first empty space, and the first buried cavity are part of* a microphone sensor having a back-chamber separated from the *first* buried cavity by a sensing diaphragm configured to move as a result of the pressure exerted thereon by sound waves reaching the *first* buried cavity.

19. The assembly of claim [18] *1*, wherein the first [integrated device further comprises a buried cavity formed within the device substrate and a membrane suspended over the buried cavity; the first integrated device comprising] *membrane, the first empty space, and the first buried cavity form* a gas sensor and the *first* membrane [including] *includes* a detection material configured to allow detecting the presence of a gaseous material[; the membrane being thermally decoupled from the device substrate].

20. The assembly of claim [1] *12*, wherein the [capping substrate includes a layer grown on the device substrate, in particular by electroplating or epitaxial steps; the capping substrate being integral to the device substrate] *second membrane includes an accelerometer*.

21. An electronic device, comprising:

[a substrate-level] *an* assembly that includes:

a device substrate of semiconductor material[,] having a top face and [housing a] *including* first [integrated device provided with an active area adjacent to the top face] *and second sensor regions*;

a [capping substrate] *cap* coupled to the device substrate above the top face so as to cover the first [integrated device] *and second sensor regions* in such a manner that a first [empty space] *cavity* is provided [in a position corresponding to the active area] *above the first sensor region and a second cavity is provided above the second sensor region, the first cavity being separate from the second cavity*; and electrical-contact elements for electrical connection [of] *to* the first [integrated device] *and second sensor regions extending* outside of the [substrate-level assembly] *first and second cavities*; and a package [encasing and mechanically protecting the substrate-level assembly; wherein the package comprises] *that includes*:

a base body mechanically supporting the [substrate-level] assembly, and

[a] *an insulative* coating [region configured to coat laterally] *material that is located on lateral sides of* the [substrate-level] assembly.

22. The device of claim 21, wherein an access duct is provided within the [capping substrate] *cap*, the access duct being fluidly connected to the first empty space and to [the] *an environment* outside of [substrate-level] *the* assembly, wherein the coating [region] leaves *the access duct* uncovered and accessible from the outside:

a top surface of the [capping substrate] *cap* defining part of a first outer face of the package, and the access duct.

23. The device of claim 21, wherein the package is of an LGA, SO, QFN or BGA type, and has contact pads carried by a surface of the base body[, which is not in contact with the substrate-level assembly and] *that* defines a second outer face of the package.

24. The device of claim 21, [further comprising a circuit die electrically coupled to the substrate-level assembly and encased by the package: wherein the device substrate and circuit die are mechanically coupled to the base body through a respective adhesion layer, and arranged side by side] *wherein the first sensor region includes a buried cavity formed in the device substrate and a membrane suspended above the buried cavity*.

25. The device of claim [21] *24*, [further comprising a circuit die electrically coupled to the substrate-level assembly and encased by the package; the circuit die being mechanically coupled to the base body, and the device substrate being mechanically coupled to the circuit die in a stacked manner] *wherein the cap includes an access duct that places the first cavity is fluid communication with an environment outside of the assembly*.

26. The device of claim 21, further comprising an access duct extending through the base body and reaching the [substrate-level] assembly at a surface thereof, opposite to the top face.

27. The device of claim 21, wherein the electronic device comprises one of: a tire-pressure monitoring system, a blood-pressure monitoring system, an ink-ejection system, and a mobile phone.

28. A process for manufacturing [a substrate-level] *an* assembly, comprising:

providing a device substrate of semiconductor material, having a top face;

forming a first [integrated device within] *sensor region in a top face of* the device substrate, [and with an active area adjacent to the top face]*the first sensor region including a buried cavity and a membrane suspended above the buried cavity*;

coupling a [capping substrate] *cap* to the device substrate above the top face so as to cover [the first integrated device, the coupling comprising forming] *and form* a first empty space [in a position corresponding to the active area] *above the membrane, the cap including a plurality of access ducts that places the first empty space in fluid communication with an environment outside of the assembly, the plurality of access ducts being of different sizes or a different inter-spacing being provided therebetween or a combination of different sizes and different inter-spacing*; and forming electrical-contact elements *from the top face of the device substrate to a bottom face of the device substrate* for electrical connection of the first integrated device with the outside of the [substrate-level] assembly.

29. The process of claim 28, [wherein forming a first integrated device further comprises forming a buried cavity within the device substrate and a membrane suspended over the buried cavity, the first empty space formed in a position corresponding to the membrane] *further comprising forming a second sensor region in the top face of the device substrate, wherein coupling the cap to the device substrate further comprises forming a second empty space above the second sensor region*.

30. The process of claim [28, further comprising forming in the capping substrate access duct fluidly connected to the first empty space and to the outside of the substrate-level assembly] *29, wherein the first empty space is fluidly isolated from the second empty space*.

31. The process of claim 28, wherein [forming a first empty space comprises forming in the capping substrate a sensor cavity above the active area of the first integrated device] *the first sensor region includes a pressure sensor component and the second sensor region includes an accelerometer component or a reference pressure sensor component*.

32. The process of claim 28, wherein [the mechanically] coupling *the cap to the device* comprises: forming a bonding region between the device substrate and the [capping substrate] *cap* and in contact with the top face of the device substrate in such a manner as to surround[, without being superimposed thereon, the active area of the first integrated device;] *an active area of the first sensor region* and joining the device substrate and the [capping substrate] *cap* via the bonding region; and wherein the first empty space is delimited, at least in part, by the bonding region.

33. The process of claim 28, wherein [forming a first integrated device further comprises forming a buried cavity within the device substrate, and a membrane suspended over the buried cavity, and forming] *the first sensor region includes* transducer elements configured to transform [into electrical signals] a deformation of the membrane[, and forming electrical-contact elements comprises: forming at least one between through vias through the device substrate, and forming electrical-connection pads on a portion of the top face of the device substrate not covered by the capping substrate; and connecting the through vias or the electrical-connection pads to the transduction elements] *into electrical signals*.

34. The process of claim 28, [wherein forming a first integrated device further comprises forming a buried cavity within the device substrate, and a membrane suspended over the buried cavity; further comprising forming in the capping substrate a first access duct, fluidly connected to the first empty space and to the outside of the substrate-level assembly, and] *further comprising* forming in the device substrate a second access duct in fluid communication with the buried cavity of the [integrated device] *first sensor region* and with the *environment* outside of the [substrate-level] assembly.

[35. The process of claim 28, further comprising forming a first access duct and a plurality of further access ducts within the capping substrate and fluidly connected to the first empty space and to the outside of the substrate-level assembly; in particular, the first and further access ducts being of different size or a different inter-spacing being provided therebetween or a combination of different size and different inter-spacing.]

36. The process of claim 28, further comprising:

forming in the device substrate at least one [further integrated device provided with a respective] *second sensor region having an* active area; *and* the coupling further comprising forming a [further] *second* empty space in a position corresponding to the respective active area of the [further integrated device;] *second sensor region,* the [further] *second* empty space being fluidly isolated from the first empty space.

37. The process of claim 36, wherein forming a [further] *second* empty space comprises forming at least [a further] *one second* sensor cavity in the [capping substrate] *cap*, over the respective active area of the [further integrated device] *second sensor region*; the forming at least [a further] *one*

*second* sensor cavity comprising separating the first empty space and the [further] *second* empty space via a separation portion of the [capping substrate] *cap*.

38. The process of claim 36, wherein [the] coupling *the cap to the device substrate* comprises forming a bonding region set between the device substrate and the [capping substrate] *cap* and in contact with the top face in such a manner as to surround[, without being superimposed thereon, the active area of the first integrated device and the respective active area of the further integrated device; the first empty space and the further empty space being delimited, at least in part, by the bonding region] *the membrane of the first sensor region*.

39. The process of claim [36, wherein forming a first integrated device] *29 wherein forming the second sensor region* comprises forming a buried cavity within the device substrate and a membrane suspended over the buried cavity, [and forming a further integrated device comprises forming a respective buried cavity within the device substrate and a respective membrane suspended over the respective buried cavity; and wherein forming a first integrated device comprises forming a pressure sensor, and forming at least one further integrated device comprises] *the process further comprising* forming an inertial sensor that comprises forming an inertial mass on the [respective] membrane [and within the further empty space] *of the second sensor region*.

40. The process of claim 39, wherein forming [an] *the* inertial mass comprises depositing directly on top of the respective membrane metal material chosen in the group comprising silver, tin, copper, lead, and gold, and having a density higher than 7000 kg/m$^3$.

41. The process of claim [36] *29*, wherein forming [a first integrated device] *the first sensor region* comprises forming *a portion of* a pressure sensor, and forming [at least one further integrated device] *a second sensor region* comprises forming *a portion of* a reference pressure sensor for the pressure sensor.

42. The process of claim 28, wherein forming [a first integrated device] *the first sensor region* comprises forming *a portion of* a microphone sensor [that includes a buried cavity within the device substrate, a membrane suspended over the buried cavity,] and a back-chamber separated from the buried cavity by a sensing diaphragm configured to move as a result of pressure exerted thereon by sound waves reaching the buried cavity.

43. The process of claim 28, wherein forming [a first integrated device] *the first sensor region* comprises forming *a portion of* a gas sensor, [and in particular a buried cavity within the device substrate, and a membrane suspended over the buried cavity; forming] the membrane [comprising forming] *of the gas sensor including* a detection material configured to allow detecting the presence of a gaseous material[, the membrane being thermally decoupled from the device substrate].

44. The process of claim 28, wherein coupling the [capping substrate] *cap* comprises growing a layer of material on the device substrate by electroplating or epitaxial steps; the [capping substrate] *cap* being integral to the device substrate.

45. A process for manufacturing an electronic device, comprising:

forming [a substrate-level] *an* assembly, the forming including:

[providing a device substrate of semiconductor material, having a top face;]

forming a first [integrated device within the device substrate and with an active area adjacent to the top face] *buried cavity in a device substrate of semiconductor material, a first membrane being located above the buried cavity*;

*forming a second buried cavity in the device substrate, a second membrane being located above the second buried cavity;* coupling a [capping substrate] *cap* to the device substrate above the top face so as to cover the first [integrated device] *and second membranes*, the coupling [comprising] forming a first empty space [in a position corresponding to the active area] *and a second empty space, the first empty space being located over the first membrane, the second empty space being located over the second membrane, the first empty space being fluidly isolated from the second empty space;* and forming electrical-contact elements *in the device substrate* for electrical connection of the first integrated device with the outside of the [substrate-level] assembly; and encasing the [substrate-level] assembly in a package, [for coating and mechanically protecting the substrate-level assembly;]

wherein the encasing comprises providing a base body to support the [substrate-level] assembly, and coating [laterally the substrate-level] *sides of the* assembly with [a] *an insulative* coating [region] *material*.

46. The process of claim 45, further comprising providing an access duct within the [capping substrate] *cap*, the access duct being fluidly [connected to] *connecting* the first empty space and to [the] *an environment* outside of the [substrate-level] assembly, wherein the coating [region] *material* is configured to leave *the access duct* uncovered and accessible from the outside:

a top surface of the [capping substrate] *cap* defining part of a first outer face of the package, and the access duct.

47. The process of claim 45, comprising forming contact pads at a surface of the base body[, which is not in contact with the substrate-level assembly] and defines a second outer face of the package.

48. The process of claim 45, further comprising [electrically coupling a circuit die to the substrate-level assembly within the package; and wherein the encasing further comprises mechanically coupling, arranged side by side, the device substrate and circuit die to the base body through a respective adhesion layer] *an inertial sensor located on top of the second membrane, the inertial sensor being configured to sense an acceleration*.

49. The process of claim 45, [further comprising electrically coupling a circuit die to the substrate-level assembly within the package; and wherein the encasing further comprises mechanically coupling the circuit die to the base body, and said mechanically coupling the device substrate to the circuit die in a stacked manner] *wherein the base body includes through vias that electrically couple the electrical-contact elements of the device substrate outside of the package*.

50. The process of claim 45, further comprising [forming an access duct extending through the base body and reaching the substrate-level assembly at a surface thereof, opposite to the top face] *forming a third buried cavity in the device substrate, a third membrane being located above the third buried cavity*.

51. An assembly comprising:

[an article, and]

*a base substrate having a first surface and a second surface;*

[a sensor assembly adapted to monitor at least one condition of the article, the sensor assembly comprising:]

a *first* device substrate of semiconductor material[.] having a top face and [housing] *including* a first [integrated device provided with] *sensor region having* an active area adjacent to the top face;

*a second device substrate of semiconductor material having a first surface and including an integrated circuit, the first device substrate being located on the first substrate of the second device substrate, the integrated circuit being electrically coupled to the first sensor region;* a [capping substrate] *cap* coupled to the *first* device substrate above the top face so as to cover the first [integrated device in such a manner] *sensor region so* that a first empty space is provided in a position [corresponding to] *above* the active area; and electrical-contact elements *extending from the first surface to the second surface of the base substrate* for electrical connection of the first [integrated device] *sensor region and the integrated circuit* outside of the [substrate-level] assembly.

52. The assembly of claim 51, wherein the first [integrated device is provided with] *sensor region includes* a buried cavity formed within the *first* device substrate and a membrane suspended over the buried cavity at the active area; the first empty space being provided in a position corresponding to the membrane.

53. The assembly of claim 51, wherein a first access duct is provided within the [capping substrate] *cap*, the first access duct being fluidly connected to the first empty space and to [the] *an environment* outside of the [substrate-level] assembly.

54. The assembly of claim 51, wherein the [capping substrate] *cap* has a first sensor cavity above the active area of the first [integrated device] *sensor region*, the first sensor cavity forming at least in part the first empty space; the first sensor cavity having a depth in the range of 10 μm and 400 μm.

55. The assembly of claim 51, further comprising a bonding region arranged between the *first* device substrate and the [capping substrate] *cap* to ensure joining thereof[, and placed in contact with the top face in such a manner as to surround, without being superimposed thereon, the active area of the first integrated device; the first empty space being delimited, at least in part, by the bonding region].

56. The assembly of claim 55, wherein the [capping substrate] *cap* is *a* flat [and not patterned] *substrate* and the bonding region has a thickness between 6 and 100 μm [to entirely define] *that defines* a thickness of the first empty space.

57. The assembly of claim 52, wherein [the electrical-contact elements comprise at least one through via made through the device substrate; and electrical-connection pads formed on a portion of the top face of the device substrate not covered by the capping substrate; and wherein] the first [integrated device further comprises] *sensor region includes* a buried cavity formed within the device substrate and a membrane suspended over the buried cavity, and transduction elements configured to transform a deformation of the membrane into electrical signals, the electrical-contact elements being connected to the transduction elements.

58. The assembly of claim 51, wherein the first [integrated device] *sensor region* further comprises a buried cavity formed within the *first* device substrate and a membrane suspended over the buried cavity; and *the cap includes* a first access duct [is provided within the capping substrate and is fluidly connected to the] *that places the* first empty space [and to the] *in fluid communication with an environment* outside of the [substrate-level] assembly [and a second access duct is provided within the device substrate in fluid communication with the buried cavity of the integrated device and with the outside of the substrate-level assembly].

59. The assembly of claim 51, wherein a first access duct and a plurality of [further] *second* access ducts are provided within the [capping substrate] *cap*, and fluidly connected to the first empty space and to [the] *an environment* outside of the [substrate-level] assembly[; the first and further access ducts being at least one of different size and separated by a different inter-spacing].

60. The assembly of claim 51, wherein [the device substrate houses at least a further integrated device provided with a respective active area; and wherein a further empty space is provided in a position corresponding to the respective active area of the further integrated device; the further empty space being fluidly isolated with respect to the first empty space] *the first and second access ducts are at least one of different size and separated by a different inter-spacing.*

61. The assembly of claim 60, wherein [the capping substrate has at least one further sensor cavity set above the respective active area of the further integrated device, and forming, at least in part, the further empty space; the first empty space and further empty space being separated in a fluid-tight manner, at least in part, by a separation portion of the capping substrate placed between the first empty space and the further empty space] *a second device substrate includes an access duct.*

62. The assembly of claim 60, further comprising a bonding region placed between the *first* device substrate and the [capping substrate] *cap*, and in contact with the top face of the *first* device substrate in such a manner as to surround, without being superimposed thereon, the active area of the first [integrated device and the respective active area of the further integrated device; the first empty space and the further empty space being delimited, at least in part, by the bonding region] *sensor region.*

63. The assembly of claim 58, [wherein the first integrated device further comprises a buried cavity formed within the device substrate and a membrane suspended over the buried cavity, and the further integrated device comprising a respective buried cavity formed within the device substrate and a respective membrane suspended over the respective buried cavity; and wherein the first integrated device is a pressure sensor, and the further integrated device is an inertial sensor, the inertial sensor comprising an inertial mass arranged on the respective membrane within the further empty space] *further comprising a coating material that is located on a portion of the first surface of the base substrate.*

64. The assembly of claim 60, wherein the first [integrated device comprises] *sensor region is a portion of* a pressure sensor[, and the further integrated device comprises a reference pressure sensor for the pressure sensor].

65. The assembly of claim 51, wherein the first [integrated device] *sensor region* further comprises a buried cavity formed within the device substrate and a membrane suspended over the buried cavity; the first [integrated device comprising] *sensor region forming part of* a microphone sensor having a back-chamber separated from the buried cavity by a sensing diaphragm configured to move as a result of the pressure exerted thereon by sound waves reaching the buried cavity.

66. The assembly of claim 65, wherein the first [integrated device] *sensor region* further comprises a buried cavity formed within the device substrate and a membrane suspended over the buried cavity; the first [integrated device comprising] *sensor region forming a portion of* a gas sensor and the membrane including a detection material configured to allow detecting the presence of a gaseous material; the membrane being thermally decoupled from the device substrate.

67. The assembly of claim 51, wherein the [capping substrate includes a layer grown on the device substrate, in particular by electroplating or epitaxial steps; the capping substrate being integral to the device substrate] *second device substrate includes an access duct that extends from the first surface to a second surface, the access duct placing a portion of the first sensor region in fluid communication with an environment outside of the assembly.*

* * * * *